(12) United States Patent
Shibuya et al.

(10) Patent No.: US 7,081,670 B2
(45) Date of Patent: Jul. 25, 2006

(54) INSULATION SHEET AND APPARATUS UTILIZING THE SAME

(75) Inventors: Akihiro Shibuya, Kanagawa (JP);
Motoyuki Furukawa, Tokyo (JP);
Mikio Naruse, Kanagawa (JP); Atsushi Ehira, Kanagawa (JP); Kazuhiro Ogawa, Yokohama (JP); Hirotoshi Oota, Aichi (JP); Kazuyoshi Abe, Aichi (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 10/914,282

(22) Filed: Aug. 10, 2004

(65) Prior Publication Data

US 2005/0035438 A1 Feb. 17, 2005

(30) Foreign Application Priority Data

Aug. 14, 2003 (JP) .............................. 2003-293494

(51) Int. Cl.
*H01L 23/10* (2006.01)
*H01L 23/34* (2006.01)

(52) U.S. Cl. ...................................... 257/707; 257/706

(58) Field of Classification Search ................ 257/706, 257/707, 709, 713, 712, 717, 705, 783
See application file for complete search history.

(56) References Cited

U.S. PATENT DOCUMENTS

| 5,569,684 | A | * | 10/1996 | Okami et al. ................ 523/209 |
| 6,169,142 | B1 | * | 1/2001 | Nakano et al. .............. 524/862 |
| 6,174,841 | B1 | * | 1/2001 | Yamada et al. .............. 508/172 |
| 6,555,905 | B1 | * | 4/2003 | Yamada et al. .............. 257/712 |
| 6,649,258 | B1 | * | 11/2003 | Yamada et al. .............. 428/334 |
| 6,884,660 | B1 | * | 4/2005 | Tetsuka et al. ............. 438/122 |
| 2004/0106717 | A1 | * | 6/2004 | Asaine ........................ 524/439 |
| 2005/0161210 | A1 | * | 7/2005 | Zhong et al. ................ 165/185 |

FOREIGN PATENT DOCUMENTS

JP 2001-110985 A 4/2001

* cited by examiner

Primary Examiner—S. V. Clark
(74) Attorney, Agent, or Firm—Foley & Lardner LLP

(57) ABSTRACT

An insulation sheet is formed by a heat conductive filler of an amount of 70–93 mass % in an organopolysiloxane base material. The content of conductive impurities in the insulation sheet is 500 ppm or less. The insulation sheet according to one embodiment is interposed between a semiconductor device and a heat sink.

20 Claims, 3 Drawing Sheets

FIG.2
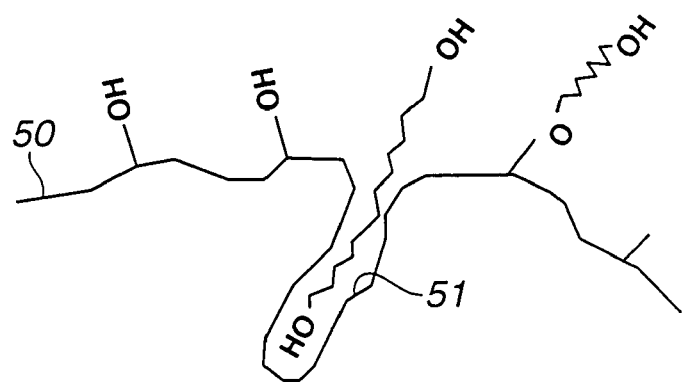
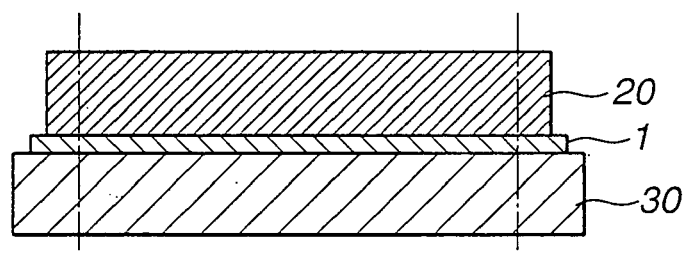
FIG.3A
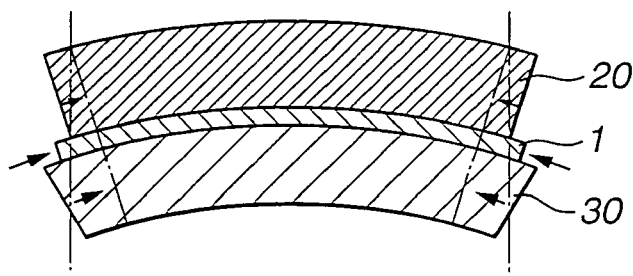
FIG.3B
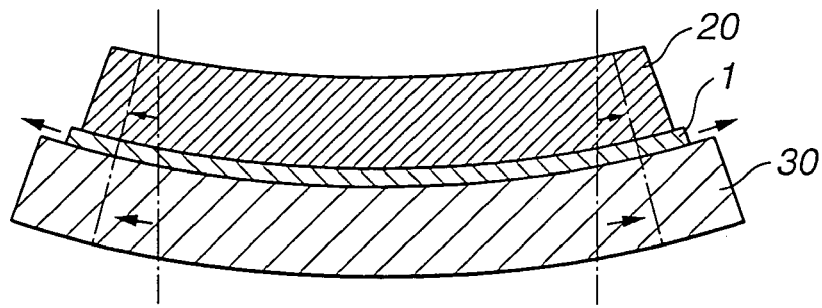
FIG.3C

INSULATION SHEET AND APPARATUS UTILIZING THE SAME

BACKGROUND OF THE INVENTION

1. Field of the Invention

The present invention relates to an insulation sheet and apparatus such as a semiconductor device assembly utilizing the insulation sheet.

2. Description of the Background Art

Certain semiconductor devices employ a metal package (including a partially metallic package) for dissipating heat generated by a loss in the inside semiconductor element. The metal package is fixed to a heat sink (cooling unit) for example with screws.

Such semiconductor device, of which package is totally or partially made of a metal, is usually fixed by interposing an insulation or insulating sheet between the semiconductor device and the heat sink, for the purpose of insulation from the metallic heat sink (as disclosed in JP-A 2001-110985).

In a prior insulation sheet employed for such purpose, a heat conductive filler is mixed in silicone rubber in order to increase the thermal conductivity. Therefore, an improvement in the thermal conductivity is achieved by increasing the amount of the heat conductive filler mixed in the silicone rubber.

SUMMARY OF THE INVENTION

However, an increase in the amount of the heat conductive filler in order to improve the thermal conductivity increases metallic impurities in the heat conductive filler, thereby easily resulting in dielectric breakdown. Also an increased amount of the heat conductive filler decreases the flexibility of the silicone rubber, whereby the insulation sheet loses resistance to thermal expansion and shrinkage under a temperature cycle caused by on/off operation of the semiconductor element or a temperature cycle caused by a temperature change in the environment of use, and generates cracks to result in defective insulation.

In consideration of the foregoing, an object of the present invention is to provide an insulation sheet showing an improved thermal conductivity without a decrease in the insulation property.

Another object of the invention is to provide a semiconductor device assembly, satisfactory in insulation property and thermal conductivity.

According to one aspect of the present invention, an insulation sheet comprises: a base material of organopolysiloxane; and a heat conductive filler by an amount of 70 to 93 mass %, an amount of a conductive impurity in the insulation sheet being 500 ppm or less.

According to another aspect of the present invention, a semiconductor device assembly comprises: a semiconductor device; a heat sink; and an insulation sheet which is provided between the semiconductor device and the heat sink and which includes at least: a base material of organopolysiloxane; and a heat conductive filler by an amount of 70 to 93 mass %, an amount of a conductive impurity in the insulation sheet being 500 ppm or less.

BRIEF DESCRIPTION OF THE DRAWINGS

FIG. 2 is a schematic view of a surface of heat conductive filler.

FIGS. 3A to 3C are schematic views showing state changes caused by a temperature change in case an insulation sheet is employed in a semiconductor device.

DETAILED DESCRIPTION OF EMBODIMENTS

According to the invention, an amount of the conductive impurities in the insulation sheet is equal to or smaller than 500 ppm. The content of the conductive impurity contained in the heat conductive filler and the content of the heat conductive filler in the insulation sheet are related to the amount of the conductive impurities. Therefore, the thermal conductivity can be improved without deteriorating the insulating property of the insulation sheet. Also since the insulation sheet is provided between the semiconductor device and the heat sink, there can be obtained a semiconductor device assembly with satisfactory insulating property and thermal conductivity.

In the following, embodiments of the present invention will be explained with reference to accompanying drawings.

(First Embodiment)

A first embodiment of the invention relates to an insulation sheet for a semiconductor device.

The insulation sheet is formed by mixing a heat conductive filler and a vulcanizing agent with a base material of organopolysiloxane, molding the mixture into an insulation sheet and effecting vulcanization by heating.

The vulcanizing agent to be employed can be, for example, an organic peroxide such as benzoyl peroxide, 2,4-dichlorobenzoyl peroxide, tert-butylbenzoyl peroxide, di-tert-butyl peroxide, dicumyl peroxide or 2,5-dimethyl-2,5-bis(tert-butylperoxy)hexane.

The content (amount) of the heat conductive filler is 70 to 93 mass % with respect to the total mass of the insulation sheet. A content of the heat conductive filler less than 70 mass % is undesirable since it is the same as in the prior insulation sheet and does not provide an improvement in the thermal conductivity. On the other hand, in the case of a content exceeding 93 mass %, the insulation sheet is mostly constituted of the heat conductive filler and becomes undesirably brittle.

The heat conductive filler to be employed can be a metal oxide or a ceramic material such as ZnO, $TiO_2$, BeO, MgO, NiOVO, CuO, FeO, AgO, $Al_2O_3$, AlN, BN, $SiO_2$, SiC, or SiN.

The amount of a conductive impurity such as iron, contained as an impurity in the heat conductive filler, is controlled at 500 ppm or less with respect to the total mass of the insulation sheet.

This is because the conductive impurity, present in excess of 500 ppm with respect to the total mass of the insulation sheet, causes a relative decrease of the insulating property when the insulation sheet is made thinner.

More specifically, for example in the case of employing aluminum oxide ($Al_2O_3$) as the heat conductive filler, it is possible, by employing aluminum of a purity of 99.99% or higher as the raw material and oxidizing it under heating in the air or in oxygen of a high purity, to maintain the conductive impurity at 500 ppm or less in the heat conductive filler and, as a result, to obtain a content of 465 ppm or less, namely 500 ppm or less, with respect to the total mass of the insulation sheet.

Figure 1A:
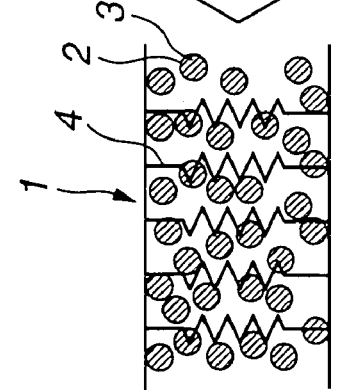
FIGS. 1A to 1C are schematic views for illustrating modes of electric conduction by heat conductive filler in an insulation sheet.
Figure 1B:
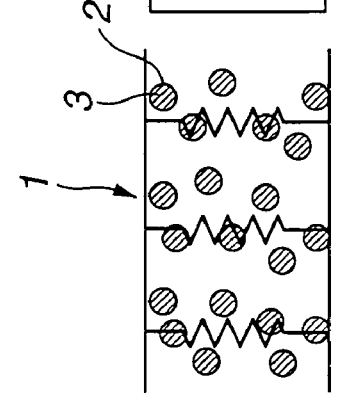
Figure 1C:
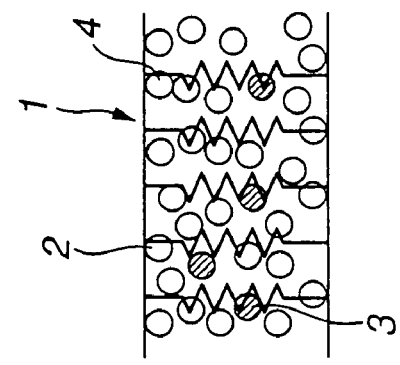

FIGS. 1A to 1C are model views for illustrating a mode of electric conduction by the heat conductive filler in the insulation sheet.

In the insulation sheet 1, as shown in FIG. 1A, a conductive impurity 3 contained in the heat conductive filler 2 forms a dielectric breakdown path 4. Therefore, in the case the fill rate (content) of a heat conductive filler 2 containing a large amount of a conductive impurity is increased, the number of the dielectric breakdown paths 4 increases together with the increase of the heat conductive filler 2, as shown in FIG. 1B, whereby the dielectric breakdown is facilitated.

On the other hand, in a heat conductive filler 2 with a low (or no) content of the conductive impurity 3, an increase in the fill rate (content) similarly increases the number of the dielectric breakdown paths 4, but each individual dielectric breakdown path 4 has a very high electrical resistance and withstands a high voltage without dielectric breakdown, because of a low content of the conductive impurity 3. For this reason, the insulating property in total is not deteriorated even if the number of the dielectric breakdown paths 4 increases. Also in the case the conductive impurity is present very little (or totally absent), the formation of the dielectric breakdown path itself is considered to be also suppressed whereby the insulating property in total is improved.

It is therefore rendered possible to increase the thermal conductivity while maintaining the high insulating property, by an increase of the heat conductive filler.

More specifically, by maintaining an iron content as the conductive impurity in the heat conductive filler at 500 ppm or less, it is possible, when the insulation sheet has a thickness of 0.2 mm, to increase the content of the heat conductive filler to 70 mass % or higher thereby increasing the thermal conductivity to about 1.5 times while retaining a withstand voltage of AC 1.5 kV or higher.

In the foregoing, iron has been considered as the conductive impurity, but also for other conductive components, the amount of the conductive impurities in the insulation sheet is preferably maintained at 500 ppm or less.

A lower limit of the content of the conductive impurities in the heat conductive filler is preferably 0 ppm, but a content of 500 ppm or less is enough as will be apparent from following examples, as it is difficult to completely eliminate the conductive impurities.

(Second Embodiment)

In the second embodiment, the heat conductive filler is preliminarily subjected to a surface treatment to improve dispersibility in organopolysiloxane constituting the base material and to improve physical properties of the insulation sheet, thereby providing the insulation sheet with flexibility.

The surface treatment of the heat conductive filler is executed by processing the heat conductive filler with silicone oil, modified (or denatured) silicone oil or a silane coupling agent (hereinafter collectively called silicone oil or the like).

Other conditions are the same as those in the aforementioned first embodiment. More specifically, a heat conductive filler with a content of conductive impurity of 500 ppm or less is contained in a base material of organopolysiloxane, in an amount of 70 to 93 mass % with respect to the total mass of the insulation sheet.

The treatment of the heat conductive filler with the silicone oil or the like is executed by adding silicone oil, modified silicone oil or silane coupling agent to the powder of heat conductive filler under agitation, followed by drying under heating. In this treatment, an amount of addition of silicone oil, modified silicone oil or silane coupling agent is about 0.1 to 5 mass % to the heat conductive filler. Such amount of addition need only be enough for treating the surface of the heat conductive filler and is not particularly restricted, but an excessively small amount is undesirable because the surface of the heat conductive filler is not sufficiently treated, while an excessively large amount is undesirable because oxidation is facilitated. Also the heat-drying time need only be a time required for sufficient drying of the heat conductive filler.

The modified silicone oil is, for example in the case of dimethyl silicone oil represented by a following chemical formula, formed by substituting methyl groups in a part, in both ends or in an end of a side chain with organic groups other than a phenyl group or a fluoroalkyl group.

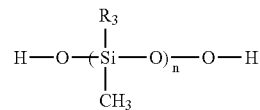

FIG. 2 is a model view schematically showin a surface of the heat-conductive filler.

Details of a mechanism for providing the insulation sheet with flexibility are not yet clarified, but it is estimated that, by the treatment of the heat conductive filler with the silicone oil or the like, an OH group present on a material surface 50 of the heat conductive filler and an OH group in the silicone oil are coupled by a dehydration condensation reaction or a molecular chain of silicone oil enters and is adsorbed in a recess 51 or the like on the material surface 50.

Such dehydration condensation reaction or adsorption on the surface of the heat conductive filler increases OH groups in the vicinity of the surface of the heat conductive filler, thereby increasing mutual solubility of the heat conductive filler and organopolysiloxane constituting the base material of the insulation sheet. Such phenomena are estimated to prevent the insulation sheet from losing the flexibility and to provide a flexibility sufficient for an insulation sheet, even in case the heat conductive filler is added at a high fill rate.

Such insulation sheet, when employed for insulation between a semiconductor device and a heat sink, can expand or shrink following the thermal expansion or shrinkage of the semiconductor device or the heat sink even under a temperature cycle caused by an on/off operation of the semiconductor element or a temperature cycle caused by a temperature change in the environment of use, whereby an insulation failure under a temperature cycle can be prevented.

FIGS. 3A to 3C are model views showing state changes caused by a temperature change in the case an insulation sheet is employed in a semiconductor device. In these drawings, a one-dot chain line indicates a central position of a screw or screw fastener for fixing the semiconductor device.

As an example, in the case a semiconductor device 20 has a copper electrode for a semiconductor element therein and a heat sink 30 is made of aluminum (for detailed structure of the semiconductor device, see third embodiment to be explained later), aluminum has a thermal expansion coefficient larger than that of copper.

Therefore, when the semiconductor device 20, insulation sheet 1 and heat sink 30 are in a stationary state in a normal temperature as shown in FIG. 3A, a distance of plural screws fixing the semiconductor device 20 is governed by the linear expansion coefficient of the heat sink 30 in a low temperature state as shown in FIG. 3B, whereby the semiconductor device 20 positioned above the heat sink 30 shows limited shrinkage and the entire configuration shows a bending convex to above. On the other hand, in a high temperature state, the semiconductor device 20 positioned above the heat sink 30 shows limited expansion and the entire configuration shows a bending convex to below, as shown in FIG. 3C. Particularly in the high temperature state, a pitch of the fixing screws increases to exert a tearing force on the insulation sheet. In such state, the insulation sheet of the second embodiment of the invention, having a sufficient flexibility, does not generate cracks and remains free from defective insulation.

(Third Embodiment)

The third embodiment provides a semiconductor device assembly, in which a semiconductor device and a heat sink are connected across an insulation sheet according to the first or second embodiment. This semiconductor device assembly is an example of so-called power module for vehicles or motor vehicles.

Figure 4:
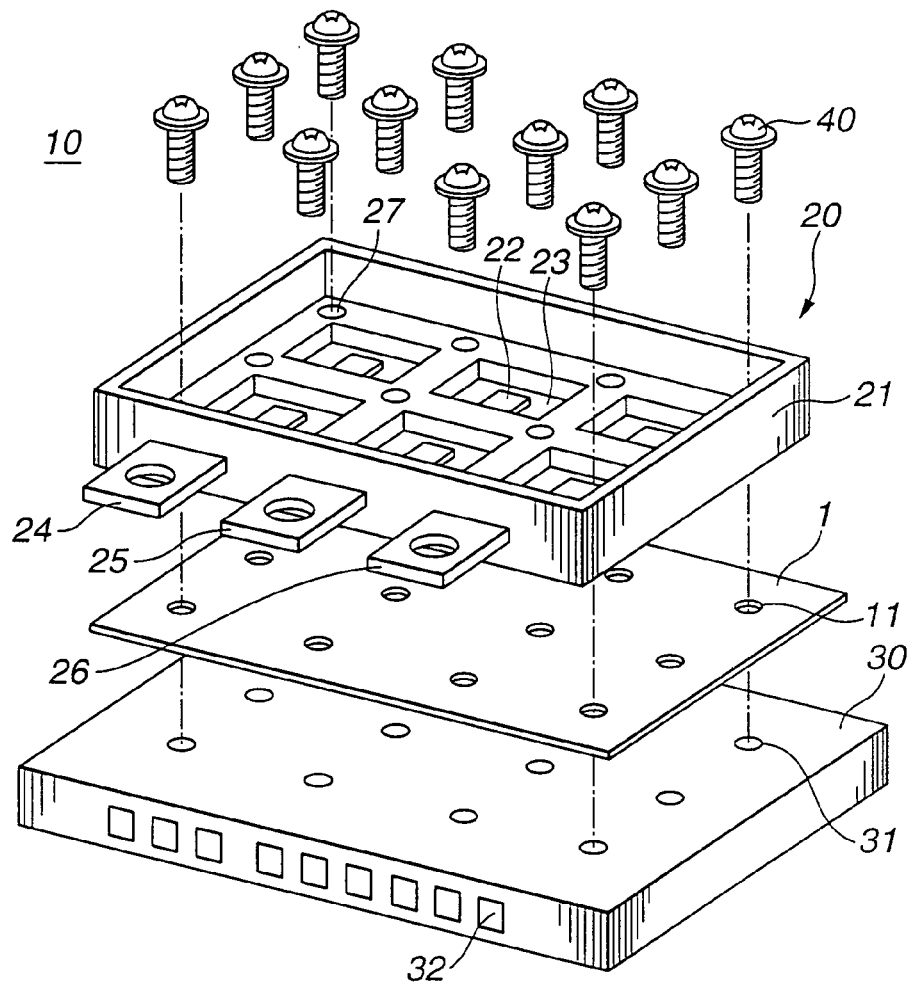
FIG. 4 is an exploded perspective view showing a semiconductor device assembly according to one embodiment of the present invention.
Figure 5:
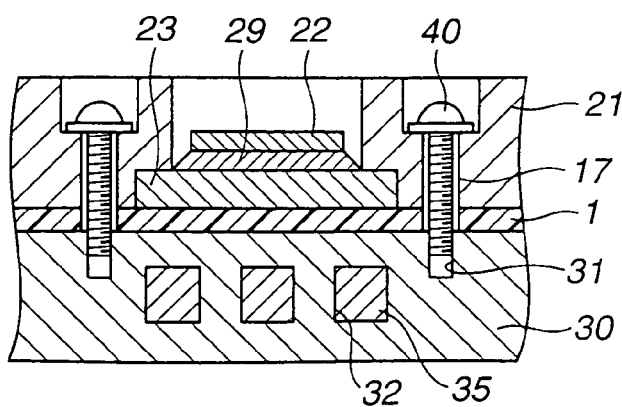
FIG. 5 is a cross-sectional view showing the semiconductor device assembly of FIG. 4.

FIG. 4 is an exploded perspective view showing a connecting state of the semiconductor device and the heat sink across the insulation sheet, and FIG. 5 is a cross-sectional view showing the connecting state of the semiconductor device and the heat sink across the insulation sheet. These drawings only illustrate principal parts, and for example a sealing material and a bonding wire for the semiconductor device are omitted.

A semiconductor device assembly 10 shown in FIGS. 4 and 5 is formed by fixing a semiconductor device 20 to a heat sink 30 with the interposition of an insulation sheet 1 according to the first or second embodiment, with a plurality of screw fasteners or screws 40.

The semiconductor device 20 includes one or more semiconductor elements 22 mounted in a metal package base 21.

Metal package base 21 of this example includes one or more electrode plates 23 each for electrical connection with semiconductor element 22. Electrode plates 23 are provided in advance. Each semiconductor element 22 is fixed to one of the electrode plates 23 by a joining member 29 such as a solder or a conductive adhesive.

Each electrode plate 23 is connected with either one of leads 24, 25 and 26 provided outside the package. The lead to which the connection is made depends on the type of the semiconductor device and the standard of the package.

Package base 21 is formed with a plurality of fixing holes 27, and the insulation sheet 1 is also formed with a plurality of holes 11 each located at a position corresponding to a unique one of the holes 27.

Each of the screw fasteners 40 passes through one of the holes 27 of package base 21 and the corresponding hole 11 of insulation sheet 1, and is screwed into a corresponding one of threaded holes 31 formed in heat sink 30.

The electrode plates 23 of the semiconductor device 20 are made of a copper-type metal (copper or copper alloy) of a high electrical conductivity.

A sealing resin (not shown) is either provided only in a portion where each semiconductor element 22 is mounted, or so formed as to cover the entire upper surface of package base 21. In the case of resin sealing of the entire package base 21, a hole for screw fixation is formed in a position corresponding to each hole 27 in the resin sealed portion.

For the resin sealing, there is employed a resin of a high insulating property and a high heat resistance. For example a resinous material such as polyphenylene sulfide (PPS), polybutylene terephthalate (PBT), epoxy (EP) or acrylonitrile-butadiene-styrene (ABS) is used.

Certain semiconductor devices are sealed with a metal can instead of such resin sealing, and the present third embodiment is applicable also to such metal can sealing.

As the insulation sheet 1, the third embodiment can employ an insulation sheet according to the aforementioned first or second embodiment.

The heat sink 30 is made of a metal such as aluminum, copper or stainless steel. The heat sink 30 in the present embodiment is water cooling type and has coolant passages 32 for passing a coolant.

Heat generated by each semiconductor element 22 is transmitted through the electrode plate 23, the joining member 29 and the insulation sheet 1, to heat sink 30, and is dissipated by coolant 35 flowing in the cooling passages 32 of the heat sink 30.

Thus the third embodiment, owing to the use of the insulation sheet of the first or second embodiment between the semiconductor device 20 and the heat sink 30, can improve heat conduction from the semiconductor device to the heat sink, thereby enabling the use of a semiconductor device of a larger heat generation or the use under a high temperature environment.

Since, for example, the semiconductor device for automobile is exposed in use to a temperature range from a low temperature of about −20 to −30° C. to a high temperature of about +100° C., such configuration is suitable for connection of the semiconductor device and the heat sink under such environment.

PRACTICAL EXAMPLES

In the following, the present invention will be clarified further by practical examples.

Insulation sheets were prepared by changing the heat conductive filler and the content of the conductive impurity therein, and physical properties, withstand voltage (or voltage resistance) and thermal conductivity of the insulation sheets were evaluated. The physical properties were a hardness, a tensile strength, an elongation and a tear strength. The physical properties and the voltage resistance were evaluated according to JIS K6249 "Testing methods for uncured and cured silicone rubber". The thermal conductivity was evaluated by a hot wire method, utilizing a quick thermal conductivity meter "QTM-500" manufactured by Kyoto Denshi Kogyo Co.(KYOTO ELECTRONICS MANUFACTURING CO.,LTD.)

Also the content of the conductive impurity was measured by an iron content, utilizing an ICP-MS method (quantitative analysis under high frequency plasma irradiation). Conductive impurities other than iron are below the limit of measurement and are irrelevant from the indicated measured value.

Compositional conditions such as the content of the heat conductive filler, and the content of the conductive impurity in the heat conductive filler in practical examples and comparative examples are shown in Table 1, and results of evaluation are shown in Table 2. In Table 1, the content of the heat conductive filler is represented as a filler amount, the content of the conductive impurity in the heat conductive filler as a conductive substance amount, and the content of the conductive impurity in the entire insulation sheet as a total conductive substance amount. Other items are represented as they are. In the practical examples (Example 1 to Example 5) and the comparative examples (Comp. Ex. 1 to Comp. Ex. 3), the insulation sheet had a thickness of 0.2 mm.

The examples 1–3 and the comparative example 3 show satisfactory results, though the examples 2 and 3 are superior in the thermal conductivity.

TABLE 1

|  | Example 1 | Example 2 | Example 3 | Example 4 | Example 5 | Comp. Ex. 1 | Comp. Ex. 2 | Comp. Ex. 3 |
|---|---|---|---|---|---|---|---|---|
| Filler amount (mass %) | 70 | 90 | 93 | 70 | 93 | 65 | 95 | 70 |
| Conductive substance amount (ppm) | 500 or less | 500 or less | 500 or less | 500 or less | 500 or less | 500 or less | 500 or less | 1000 or less |
| Total conductive substance amount (ppm) | 350 or less | 450 or less | 465 or less | 350 or less | 465 or less | 325 or less | 475 or less | 700 or less |
| Oil treatment | no | no | no | yes | yes | no | no | no |

TABLE 2

|  | Example 1 | Example 2 | Example 3 | Example 4 | Example 5 | Comp. Ex. 1 | Comp. Ex. 2 | Comp. Ex. 3 |
|---|---|---|---|---|---|---|---|---|
| Hardness | 91 | — | 94 | 87 | 90 | — | 96 | — |
| Tensile strength (Mpa) | 1.6 | — | 2.8 | 1.7 | 1.7 | — | 2.9 | — |
| Elongaton(%) | 35 | — | 25 | 38 | 35 | — | 19 | — |
| Withstand voltage (kV) | 1.5 or higher | 1.5 or higher | 1.5 or higher | 1.5 or higher | 1.5 or higher | 1.5 or higher | 1.5 or higher | 1.2 or higher |
| Thermal conductivity (W/m · K) | 5 | 7.2 | 7.5 | 5 | 5 | 4 | 7.7 | 5 |
| Result of temperature cycle | withstand voltage lowered at 200 cycles or less | withstand voltage lowered at 200 cycles or less | withstand voltage lowered at 200 cycles or less | withstand voltage maintained at 600 cycles or more | withstand voltage maintained at 600 cycles or more | not tested (due to insufficient initial thermal conductivity) | not tested (due to initial brittle-ness of sheet) | not tested (due to insufficient initial withstand voltage) |

The practical examples and the comparative examples will be explained in the following.

Practical Examples 1–3 and Comparative Examples 1, 2

A base material of organopolysiloxane was mixed with alumina (aluminum oxide $Al_2O_3$) powder AL30, manufactured by Showa Denko K. K., as a heat conductive filler in varying contents, together with a vulcanizing agent, then formed into the shape of an insulation sheet and vulcanized under heating to obtain an insulation sheet. A content of the conductive impurity in the heat conductive filler was controlled at 500 ppm or less in each of the examples and the comparative examples. The insulation sheet of each example was prepared with a thickness of 0.2 mm.

Tables 1 and 2 indicate that the thermal conductivity was improved when the content of the heat conductive filler was 70 mass % or higher with respect to the total mass of the insulation sheet. The withstand voltage was relatively satisfactory, since the content of the conductive impurity (iron in this case) in the heat conductive filler was maintained at 500 ppm or less as in the practical examples.

It can be observed, however, that the sheet became hard and brittle when the content of the heat conductive filler exceeded 93 mass %.

Practical Examples 1–3 and Comparative Example 3

With reference to the practical examples 1–3, a comparative example 3 was prepared with a different content of the conductive impurity in the heat conductive filler.

On the other hand, as to the withstand voltage, the practical examples 1–3 are evidently better than the comparative example 3. This indicates that the withstand voltage of the entire insulation sheet is influenced by the content of the conductive impurity in the entire insulation sheet. It is therefore understood effective to control the conductive impurity in the insulation sheet at 500 ppm or less as in the embodiments of the present invention.

Examples 4 and 5

Practical example 4 employed, as the heat conductive filler, aluminum nitride (AlN) powder TOYALNITE R15S (average particle size 15 μm), manufactured by Toyo Aluminum K.K., treated with a silicone oil YF3905, manufactured by GE-Toshiba Silicone Co.

The treatment was executed by charging the aforementioned aluminum nitride powder in a mixer and adding the aforementioned silicone oil under agitation. An amount of addition of the silicone oil was 0.05 mass % of aluminum nitride. Subsequent to agitation for 30 minutes after the addition, drying under heating was executed for 1 hour in an oven at 200° C.

This heat conductive filler was mixed with a base material of organopolysiloxane together with a vulcanizing agent, then formed into the shape of an insulation sheet and vulcanized under heating to obtain an insulation sheet. A content of the conductive impurity in the heat conductive filler was controlled to be 500 ppm or less. The thickness of the insulation sheet was 0.2 mm.

Practical example 5 employed, as the heat conductive filler, alumina ($Al_2O_3$) powder AL30, manufactured by Showa Denko K. K., treated with a silane coupling agent A274 manufactured by Nippon Unicar Co. Ltd.

The treatment was executed by charging the aforementioned alumina in a mixer and adding the aforementioned silane coupling agent diluted with methanol of the same amount, under agitation. An amount of addition of the silane coupling agent was 0.1 to 5 mass % of alumina, and it was so added as to well cover alumina, under observation of the process. Subsequent to agitation for 30 minutes after the addition, drying under heating was executed for 30 minutes to 1 hour in an oven of 50–200° C. The temperature and the drying time were changed within these ranges according to the treated amount.

The heat conductive filler was mixed with a base material of organopolysiloxane together with a vulcanizing agent, then formed into the shape of an insulation sheet and vulcanized under heating to obtain an insulation sheet. A content of the conductive impurity in the heat conductive filler was controlled to be 500 ppm or less. The insulation sheet was prepared with a thickness of 0.2 mm.

These practical examples 4 and 5 and practical examples 1–3 were subjected to a temperature cycle test in addition to the aforementioned evaluations. The temperature cycle test was executed, on plural samples, in a thermal shock chamber(TSA-71S manufactured by Espec Co.) with a holding time of 15 to 60 minutes at lowest and highest temperatures of −40 to 120° C. and an interim exposure time of 5 minutes at the normal temperature.

As shown in Tables 1 and 2, the practical examples 4 and 5 which were given the flexibility by treating the heat conductive filler with oil or silane coupling agent did not show a decrease in the withstand voltage even after 600 cycles with different holding times. On the other hand, in the example 1 (without oil treatment) of a conductive filler content substantially same as that in the examples 4 and 5, all the plural samples showed a decrease in the withstand voltage before the completion of 200 cycles.

As to the flexibility, it is preferable, while maintaining a withstand voltage of AC 1.5 kV or higher and a thermal conductivity of 5 W/mK or higher, to secure a hardness of 50–90, a tensile strength of 1.7–10 MPa, and an elongation of 35–200%. Such ranges can be attained by regulating the amount of the heat conductive filler, and the treating condition with silicone oil or silane coupling agent.

Also in compositional conditions the same as in the practical example 1, the withstand voltage alone was evaluated under varying thickness of the insulation sheet. As a result, a thickness of about 0.15 to 0.3 mm was found preferable. At a thickness of about 0.1 mm, the withstand voltage was lowered to result in a deterioration of the insulating property of the insulation sheet. On the other hand, a thickness exceeding 0.3 mm was undesirable because the thermal conductivity was not improved even with an increase in the heat conductive filler, and the thermal conductivity became lower at a larger thickness.

This application is based on a prior Japanese Patent Application No. 2003-293494 filed on Aug. 14, 2003. The entire contents of this Japanese Patent Applications No. 2003-293494 are hereby incorporated by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A semiconductor device assembly comprising:
a semiconductor device;
a heat sink, and
an insulation sheet, provided between the semiconductor device and the heat sink, the insulation sheet comprising:
  (i) a base material of organopolysiloxane; and
  (ii) a heat conductive filler by an amount of 70 to 93 mass % with respect to a total mass of the insulation sheet, an amount of a conductive impurity in the insulation sheet being 500 ppm or less; and
wherein the insulation sheet has a withstand voltage of AC 1.5 kV or higher, a thermal conductivity of 5 W/mK or higher, a hardness of 50~90, a tensile strength of 1.7~10 MPa, and an elongation of 35~200%.

2. A semiconductor device assembly according to claim 1, wherein the heat conductive filler has surfaces treated to provide the insulation sheet with flexibility.

3. A semiconductor device assembly according to claim 2, wherein the conductive filler is a filler processed by surface treatment of adding one of a silicon oil, a modified silicone oil and a silane coupling agent to the heat conductive filler under agitation, and drying at an elevated temperature.

4. A semiconductor device assembly according to claim 2, wherein the conductive filler is a filler processed by surface treatment of adding one of a silicon oil, a modified silicone oil and a silane coupling agent to the heat conductive filler under agitation, and drying by heating.

5. A semiconductor device assembly according to claim 1, wherein the semiconductor device assembly is adapted for use in a vehicle.

6. A semiconductor device assembly according to claim 2, wherein the semiconductor device assembly is adapted for use in a vehicle.

7. A semiconductor device assembly according to claim 1, wherein the semiconductor device includes a semiconductor element, and a base on which the semiconductor element is mounted; and the insulation sheet is sandwiched between the base and the heat sink.

8. A semiconductor device assembly according to claim 7, wherein the base, the insulation sheet and the heat sink are joined by a plurality of fasteners.

9. A semiconductor device assembly according to claim 8, wherein the heat sink is formed with a coolant passage.

10. A semiconductor device assembly according to claim 1, wherein the conductive impurity is iron, and the amount of iron is equal to or less than 500 ppm with respect to the total mass of the insulation sheet.

11. A semiconductor device assembly comprising:
a semiconductor device;
a heat sink, and
an insulation sheet, provided between the semiconductor device and the heat sink;
wherein the insulation sheet has a withstand voltage of AC 1.5 kV or higher, a thermal conductivity of 5 W/mK or higher, a hardness of 50~90, a tensile strength of 1.7~10 MPa, and an elongation of 35~200%.

12. A semiconductor device assembly according to claim 11, comprising a heat conductive filler which has surfaces treated to provide the insulation sheet with flexibility.

13. A semiconductor device assembly according to claim 12, wherein the conductive filler is a filler processed by surface treatment of adding one of a silicon oil, a modified silicone oil and a silane coupling agent to the heat conductive filler under agitation, and drying at an elevated temperature.

14. A semiconductor device assembly according to claim 13, wherein the conductive filler is a filler processed by surface treatment of adding one of a silicon oil, a modified silicone oil and a silane coupling agent to the heat conductive filler under agitation, and drying by heating.

15. A semiconductor device assembly according to claim 11, wherein the semiconductor device assembly is adapted for use in a vehicle.

16. A semiconductor device assembly according to claim 12, wherein the semiconductor device assembly is adapted for use in a vehicle.

17. A semiconductor device assembly according to claim 13, wherein the semiconductor device includes a semiconductor element, and a base on which the semiconductor element is mounted; and the insulation sheet is sandwiched between the base and the heat sink.

18. A semiconductor device assembly according to claim 17, wherein the base, the insulation sheet and the heat sink are joined by a plurality of fasteners.

19. A semiconductor device assembly according to claim 18, wherein the heat sink is formed with a coolant passage.

20. A semiconductor device assembly according to claim 11, further comprising iron, and wherein the amount of iron is equal to or less than 500 ppm with respect to the total mass of the insulation sheet.

* * * * *